United States Patent [19]

Chu et al.

[11] 3,846,643

[45] Nov. 5, 1974

[54] DELAYLESS TRANSISTOR LATCH CIRCUIT

[75] Inventors: William M. Chu, Poughkeepsie; James M. Lee; Gary C. Luckett, both of Wappingers Falls, all of N.Y.

[73] Assignee: International Business Machines Corporation, Armonk, N.Y.

[22] Filed: June 29, 1973

[21] Appl. No.: 375,272

[52] U.S. Cl. ............ 307/247 R, 307/205, 307/251, 307/279

[51] Int. Cl. ...................... H03k 17/60, H03k 3/286

[58] Field of Search ........... 307/205, 268, 279, 247, 307/286, 251

[56] References Cited

UNITED STATES PATENTS

| | | | |
|---|---|---|---|
| 3,286,102 | 11/1966 | Salam | 307/286 X |
| 3,384,765 | 5/1968 | Gilligan | 307/286 X |
| 3,538,349 | 11/1970 | Smith | 307/286 X |
| 3,573,507 | 4/1971 | Eng | 307/279 |
| 3,594,736 | 7/1971 | Hoffmann | 307/279 |
| 3,737,682 | 6/1973 | Ahmed | 307/247 R |

*Primary Examiner*—John S. Heyman
*Attorney, Agent, or Firm*—Theodore E. Galanthay

[57] ABSTRACT

Disclosed is a semiconductor circuit including a latching means operatively connected to an intermediate node between an input means and an output means for providing a latched output signal without introducing circuit delay due to the latching function.

5 Claims, 2 Drawing Figures

DELAYLESS TRANSISTOR LATCH CIRCUIT

BACKGROUND OF THE INVENTION

1. Field of the Invention

This invention relates to a field effect transistor parallel latch and more particularly to a latch circuit performing a latching function without delaying the propagation of the signal to be latched.

2. Description of the Prior Art

Latching circuits such as bistable triggers, for example, are notoriously well known in the prior art. In one form, such latching circuits receive an input signal such as a set signal which is then provided at the output of the latch in true/complement form, if desired. Subsequently, the input signal can be altered, but the output cannot change until after the occurrence of a reset input to the latch. Typically, the output of the latch does not become available until after the latching function has been completed. In high speed circuits, such time delay is undesirable.

SUMMARY OF THE INVENTION

Accordingly, it is an object of the present invention to provide a latching function without introducing circuit delay.

It is another object of this invention to provide such a latching circuit in the form of integrated semiconductor field effect transistors.

In accordance with the invention, a latching circuit including a pair of cross-coupled transistors is connected to a single point in the signal path between an input means and an output means. Thus, the signal propagates from the input node to the output node in its normal manner, however, the latching circuit connected at this single point, an intermediate node, latches the signal at this intermediate node maintaining the output signal at a desired one of two binary levels.

The foregoing and other objects, features and advantages of the invention will be apparent from the following and more particular description of the preferred embodiment of the invention as illustrated in the accompanying drawings.

DESCRIPTION OF THE PREFERRED EMBODIMENT

Figure 1:
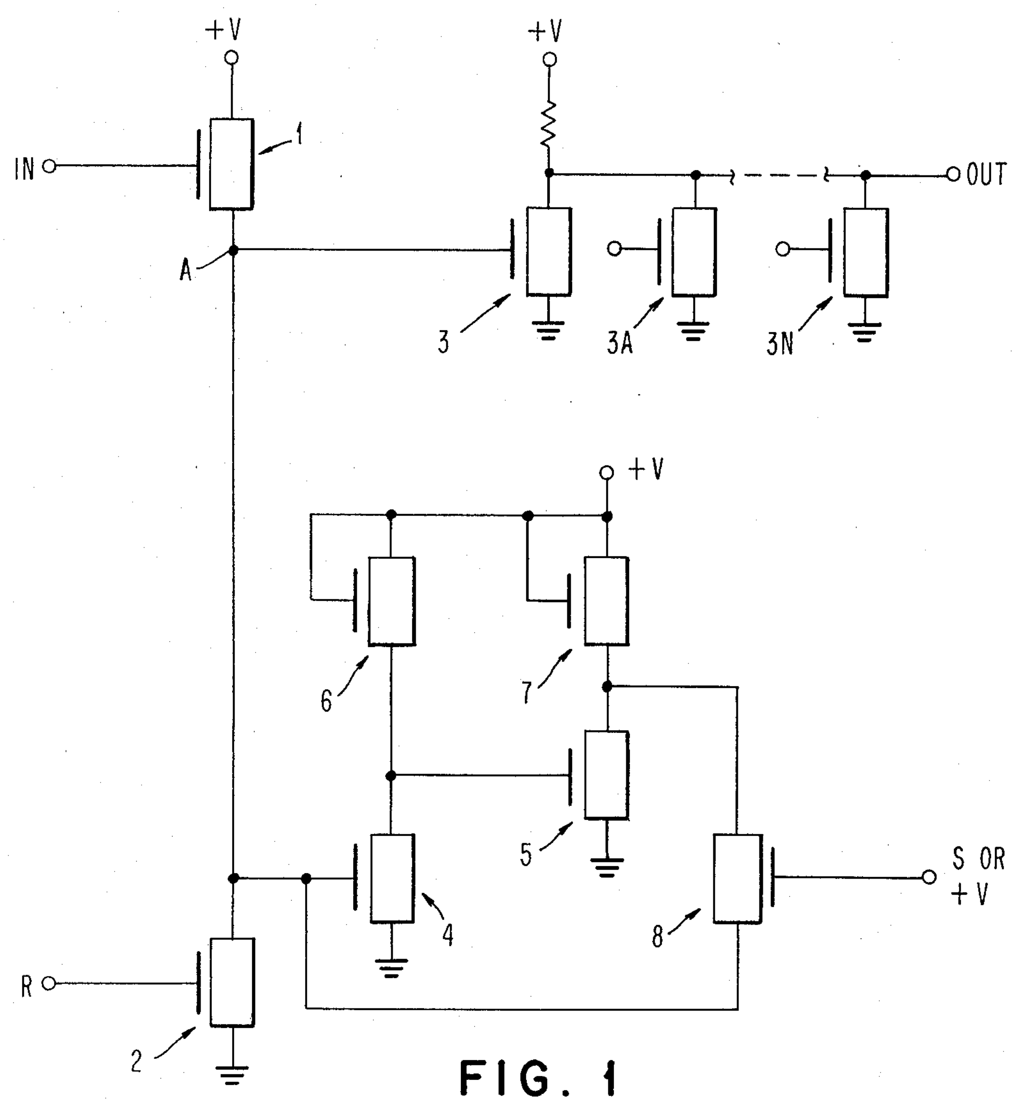
FIG. 1 is a schematic circuit diagram of the preferred embodiment of the invention.

Refer now to FIG. 1 for a description of the preferred embodiment. A source of power +V is applied to the drain electrode of input transistor 1. Typically, +V is approximately 8–10 volts in known N-channel field effect transistor technology, however, potentials of different amplitude and even different polarity as for P-channel field effect transistor technology would be engineering expedients. The input to the circuit is received at the input node IN and is connected to the gating electrode of transistor 1. The source of transistor 1 is connected to intermediate node A which is also connected to the gating electrode of output transistor 3. The source of output transistor 3 is grounded while its drain electrode is connected to the output node OUT. Load resistor R connected between +V and the output node is an off-chip load common to other output transistors such as 3A and 3N.

The latching means consisting of transistors 2, 4, 5, 6, 7, and 8, is also connected to intermediate node A. Note that node A is the single point in the signal path between the input node and the output node to which the latching means is operatively connected. The latching means is further connected to the source of power +V and to the second potential level, ground. Connected to node A is the drain of transistor 2, the gating electrode of transistor 4 and the source of transistor 8. The gating electrode of transistor 2 is connected to a reset node R. The source electrodes of transistors 2, 4, and 5 are connected to ground potential. Transistors 4 and 5 have their drain and gate electrodes cross-coupled. Isolation transistor 8 has its drain to source connected in a series path between the gating electrode of transistor 4 and the drain electrode of transistor 5. Transistors 6 and 7 have their gate and drain electrodes connected to +V and form load transistors having their source electrodes connected to the drains of transistors 4 and 5, respectively. The gating electrode of transistor 8 is connected either to a pulse source S or to a steady state potential +V. The purpose of isolation transistor 8 is to isolate node A from the common point between transistors 5 and 7.

Figure 2:
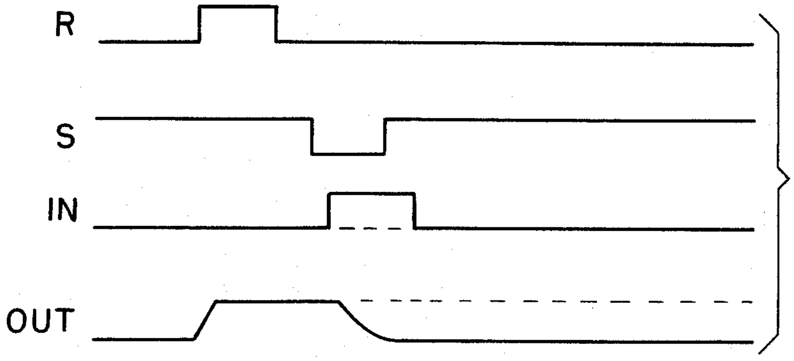
FIG. 2 is a series of waveform diagrams illustrating the operation of the present invention as illustrated by the preferred embodiment.

In operation, the input node is normally at a down level conditioning transistor 1 off, as the reset pulse R becomes positive as illustrated in FIG. 2, turning reset transistor 2 on. This resets the latch and also brings node A to a down level turning transistor 3 off bringing the output to an up level. In the reset condition, transistor 4 is off permitting transistor 5 to turn on. At this point in time, transistor 8 is also conditioned on but is likely to conduct no current since both its gated electrodes are at a down potential.

In one embodiment, where the gating electrode of transistor 8 is connected to an S-pulse, transistor 8 is turned off prior to the occurrence of the input pulse. If the input signal is an up level signal applied at the input node, as illustrated in the heavy lines in FIG. 2, transistor 1 will turn on bringing intermediate node A to an up level, turning transistor 3 on, bringing the output node to a down level.

Simultaneously, and without delaying the occurrence of the down level signal at the output node, transistor 4 is turned on causing transistor 5 to turn off permitting the common point between transistors 7 and 5 to charge to an up level through transistor 7. By this time, the gating electrode of transistor 8 is brought to an up level permitting the up level signal at the common point between transistors 5 and 7 to be applied at the gating electrode of transistor 4 as well as intermediate node A, thereby completing the latching function. In the event that the applied input signal is at a down level, transistor 1 will remain off, node A will remain at a down level, and the output will remain at an up level as illustrated in dotted lines in FIG. 2. In this same alternative, transistor 4 will remain off permitting transistor 5 to remain on and when transistor 8 is rendered conductive by the up level S-pulse, then the down level is maintained at the gating electrode of transistor 4 by the conductive path to ground through transistors 8 and 5. In this manner, the intermediate node A is latched to a down level.

If transistor 8 were not present in the cross-coupling path, then in the event that the input signal renders transistor 1 conductive when transistor 5 was already conductive, additional power would be dissipated in order to bring node A to an up level, turn transistor 4 on, and finally turn transistor 5 off, permitting node A to fully rise to an up level. This absence of transistor 8 would also slow down the rising of node A.

For this reason, transistor 8 must provide a high impedance path during the foregoing switching operation. On the other hand, a relatively low impedance path is provided by the S-pulse turning transistor 8 on at all other times in the cross-coupling path in order to perform the latching function.

In an alternate embodiment, it was found that by designing transistor 8 to have a relatively high impedance in its on state, its gating electrode could be connected to $+V$ at all times. This relatively high impedance permits sufficient leakage current to perform the latching function, while being sufficiently high to isolate node A from the common node between transistors 5 and 7. For satisfactory operation, the impedance of transistor 8 should be at least 10 times the impedance of transistor 1. Such ratioing of impedances is well known and in the present circuit transistors 6 and 7 are also designed as relatively high impedance devices. The remaining transistors 1, 2, 3, 4, and 5 are designed to have a relatively lower impedance in their on state.

While the invention has been particularly shown and described with reference to the preferred embodiment thereof, it will be understood by those skilled in the art that various changes in form and details may be made therein without departing from the spirit and scope of the invention.

What is claimed is:

1. A semiconductor circuit for providing a latched output signal without introducing circuit delay due to the latching function comprising:

an input node;

an intermediate node;

an output node;

a field effect transistor having a gating electrode and two gated electrodes, the first of said gated electrodes being operatively connected to a first fixed potential level, the second of said gated electrodes being operatively connected to said intermediate node, said gating electrode being operatively connected to said input node;

a plurality of parallel connected field effect transistor gates each having two gated electrodes and a gating electrode, one of said plurality of field effect transistors having its gating electrode operatively connected to said intermediate node, the first each of the gated electrodes of said plurality being operatively connected to said output node, the second of the gated electrodes of said plurality being operatively connected to a second fixed potential level; and latching means operatively connected to said intermediate node, responsive to and holding the signal on said intermediate node, thereby latching the signal at said output node, said latching means having a pair of cross-coupled field effect transistors, a pair of load field effect transistors, each operatively associated with one of said cross-coupled field effect transistors having a gating electrode operatively connected to said intermediate node, isolation means operatively connected in a series path between said gating electrode and a gated electrode of the other one of said cross-coupled field effect transistors; and reset means operatively connected between the intermediate node and said second fixed potential level.

2. A semiconductor circuit as in claim 1 wherein said load field effect transistors each include:

a field effect transistor having a gating electrode and two gated electrodes, said gating electrode being operatively connected to one of said gated electrodes.

3. A semiconductor circuit as in claim 1 wherein said isolation means comprises:

a field effect transistor having two gated electrodes and a gating electrode, said gating electrode being operatively connected to a fixed potential level.

4. A semiconductor circuit as in claim 1 wherein said isolation means comprises:

a field effect transistor having two gated electrodes and a gating electrode, said gating electrode receiving a gating pulse.

5. A semiconductor circuit as in claim 1 wherein said reset means forms a gateable load for said field effect transistor having a gating electrode and two gated electrodes, the first of said gated electrodes being operatively connected to a first fixed potential level, the second of said gated electrodes being operatively connected to said intermediate node, said gating electrode being operatively connected to said input node.

* * * * *